United States Patent
White

(10) Patent No.: US 7,224,759 B2
(45) Date of Patent: May 29, 2007

(54) METHODS AND APPARATUS FOR DELAY FREE PHASE SHIFTING IN CORRECTING PLL PHASE OFFSET

(75) Inventor: Stanley A. White, San Clemente, CA (US)

(73) Assignee: Honeywell International Inc., Morristown, NJ (US)

( * ) Notice: Subject to any disclaimer, the term of this patent is extended or adjusted under 35 U.S.C. 154(b) by 905 days.

(21) Appl. No.: 10/193,416

(22) Filed: Jul. 11, 2002

(65) Prior Publication Data

US 2004/0008800 A1 Jan. 15, 2004

(51) Int. Cl.
*H04L 7/00* (2006.01)
*H04L 25/00* (2006.01)
*H04L 25/40* (2006.01)

(52) U.S. Cl. ............... 375/371; 375/215; 375/294; 375/373; 375/375; 375/376; 375/327

(58) Field of Classification Search ......... 375/371, 375/375, 327, 215, 294, 373, 376
See application file for complete search history.

(56) References Cited

U.S. PATENT DOCUMENTS

| | | | |
|---|---|---|---|
| 4,075,698 A | 2/1978 | Lode | |
| 4,677,395 A | 6/1987 | Baker | |
| 4,799,385 A | 1/1989 | Hulsing et al. | |
| 5,313,503 A | 5/1994 | Jones et al. | |
| 5,444,639 A * | 8/1995 | White | 708/300 |
| 5,451,894 A | 9/1995 | Guo | |
| 5,577,073 A * | 11/1996 | White | 375/324 |
| 5,604,771 A * | 2/1997 | Quiros | 375/326 |
| 5,619,148 A | 4/1997 | Guo | |
| 5,841,032 A | 11/1998 | Froggatt | |
| 5,940,449 A | 8/1999 | Kaaden et al. | |
| 5,982,238 A | 11/1999 | Soderquist | |
| 6,133,964 A | 10/2000 | Han | |
| 6,160,434 A | 12/2000 | Yoshimura et al. | |
| 6,310,570 B1 | 10/2001 | Rumreich et al. | |
| 6,564,636 B2 * | 5/2003 | White | 73/504.02 |
| 6,603,391 B1 * | 8/2003 | Greeff et al. | 340/10.3 |
| 6,725,169 B2 * | 4/2004 | Thielman et al. | 702/104 |

OTHER PUBLICATIONS

International Search Report dated Dec. 19, 2003, Application No. PCT/US03/22004, 6 pages.
Roden, Martin S., Analog and Digital Communication Systems, 4th edition, Prentice-Hall, Inc., Upper Saddle River, NJ, pp. 470-523.

* cited by examiner

*Primary Examiner*—Dac Ha
*Assistant Examiner*—Ted M. Wang
(74) *Attorney, Agent, or Firm*—Andrew Abeyta, Esq.; Armstrong Teasdale LLP

(57) ABSTRACT

An apparatus eliminates a differential phase shift, $\Delta\theta(f)$, between a double sideband suppressed carrier modulated angular rate information signal and its sinusoidal demodulation reference signal in a gyroscope angular rate sensing circuit including a signal reference source. The apparatus includes a demodulator, a phase shifter in a demodulation reference signal path, the demodulation reference signal path being between the signal reference source and the demodulator. The phase shifter is configured to adjust a phase of the sinusoidal demodulation reference signal. A phase locked loop (PLL) includes a phase detector, a servo equalizer, and a dual-frequency, numerically controlled oscillator. The PLL is configured to provide a demodulation signal based on the phase shifted demodulation reference signal, and a phase shift command source is configured to provide an input to the phase shifter to command an appropriate phase adjustment.

17 Claims, 5 Drawing Sheets

METHODS AND APPARATUS FOR DELAY FREE PHASE SHIFTING IN CORRECTING PLL PHASE OFFSET

BACKGROUND OF THE INVENTION

This invention relates generally to digital signal processing (DSP) and, more specifically, to methods and apparatus for the demodulation of a digitized first information bearing signal by a digitized second demodulation reference signal.

A phase-locked loop (PLL) generates an output waveform, such as a sinusoid, that is intended to be locked in both frequency and phase to a reference waveform. The purpose of the PLL action is to synchronize the PLL output waveform with that of an input reference waveform. Depending upon the application, the requirement may be to lock on an input-reference source waveform, or a phase-modified received waveform. However, if the received waveform has been filtered or delayed subsequent to its generation, the PLL output signal will be synchronized with the received signal, but not with the source signal. If the phase difference between the source and received waveforms is small, there may be little consequence. Further, if the phase difference is constant, no matter what the size, it can be compensated by a fixed offset introduced at the phase detector.

However, in certain applications, the phase difference is frequency-sensitive and the frequency of operation is not exactly known, resulting in a phase error which can deleteriously effect the performance of the system in which the PLL is a component. Specifically, in digital gyroscope applications, a frequency sensitive error due both to delays and linear filtering is known to exist. More specifically, two signals are developed within a gyroscope. The first signal is an information signal which carries DSSC (double sideband suppressed carrier) modulated angular rate information of rotation about an input axis of the gyroscope. The second signal is a demodulation reference signal which approximates a sinusoid that is perfectly in phase with the suppressed carrier of the information signal. The two signals are routed along different paths within a gyroscope angular rate sensing system and therefore are subject to both intentional and unintentional filtering and propagation delays which introduce phase shift between the two signals.

If there is a non-zero differential phase shift, that is, if the phase shifts between the two signals are unequal, signal loss and significant errors can occur in a demodulator within the angular rate sensing system which receives both signals as input. The effects of differential phase shift can be mitigated by placing additional filtering in one or both signal paths to substantially eliminate the differential phase shift. Unfortunately, this solution has a potential disadvantage because such a solution can cause problems within the angular rate sensing system that arise due to the introduction of additional delay.

In one specific application, the demodulated angular rate information signal is applied to a flight control computer for navigation, flight control, and stability augmentation of an airborne vehicle. Since the above described digital signal processing operations occur within a closed loop system (the flight control system), critical servo stability issues are at stake, and delays in the two above described signal paths must be minimized.

BRIEF SUMMARY OF THE INVENTION

In one aspect, an apparatus is provided which eliminates a generally frequency dependent differential phase shift, $\Delta\theta(f)$, between a double sideband suppressed carrier modulated angular rate information signal and its sinusoidal demodulation reference signal in a gyroscope angular rate sensing circuit. The rate sensing circuit includes a demodulation reference source. The apparatus comprises a demodulator, a PLL that provides the actual demodulating signal, a phase shift command source, and a phase shifter in a demodulation reference signal path. The PLL comprises a phase detector, a servo equalizer, and a dual-frequency numerically controlled oscillator (NCO). The demodulation reference signal path is between the demodulation reference source and the phase detector because the actual demodulating signal is the PLL output. The phase shifter is configured to adjust a phase of the sinusoidal demodulation reference signal and the phase shift command source is configured to provide an input to the phase shifter to command an appropriate phase adjustment.

In another aspect, a method for eliminating a differential phase shift, $\Delta\theta(f)$, between a double sideband suppressed carrier modulated information signal and its sinusoidal demodulation reference signal in a circuit is provided. The circuit includes a demodulator, a phase shift command source and a phase shifter in the reference signal path between the signal reference source and the demodulator. The method comprises generating an appropriate phase adjustment command from the phase shift command source to the phase shifter and adjusting a phase of the demodulating sinusoidal reference signal with the phase shifter.

In a further aspect, an angular rate measurement system is provided which comprises a gyroscope configured to sense an angular rate input and provide a modulated angular rate information signal and a sinusoidal demodulation reference signal and a demodulator configured to demodulate a signal representative of the angular rate information signal. The system also comprises a phase shifter configured to adjust a phase of a signal representative of the sinusoidal demodulation reference signal. The system comprises a phase locked loop configured to provide a demodulation signal to the demodulator, the demodulation signal being based on the phase adjusted demodulation reference signal. The system also comprises a phase shift command source configured to provide a frequency based input to the phase shifter to enable an appropriate phase adjustment of the demodulation reference signal. The phase adjustment eliminates a frequency dependent differential phase shift, $\Delta\theta(f)$, between the modulated angular rate information signal and the sinusoidal demodulation reference signal.

DETAILED DESCRIPTION OF THE INVENTION

In the embodiments herein described, differential phase shift is substantially eliminated between a double sideband suppressed carrier (DSSC) modulated angular rate information signal and a demodulation reference signal by inserting a delay-free phase shifter circuit in a signal path of the demodulation reference signal. The demodulation reference signal drives a phase-locked loop (PLL) which outputs very high quality sinusoidal and cosinusoidal outputs which are utilized as demodulating signals. The PLL also provides half-frequency motor-drive signals. By placing a phase shifter in one of the signal paths to the phase detector of the PLL, phase control of a very high quality is achieved. A delay-free phase shifter for sinusoidal and cosinusoidal signals is obtained by direct mechanization of the expansion formula for the sine and the cosine of the sum of two angles, i.e., sin(x+y)=sin(x)cos(y)+cos(x)sin(y) and cos(x+y)=cos(x)cos(y)−sin(x)sin(y).

As described below, the phase shifter circuit may be placed in either of the two input paths to the phase detector of a phase-locked loop (PLL), thereby shifting the phase of an input reference signal within the PLL. By applying the sine and cosine of the differential phase shift from a phase shift command source as the input value to the phase shifter, thereby commanding an appropriate phase adjustment, the phase error between the two input paths is substantially eliminated within in the PLL without introducing additional delay.

The differential phase, $\Delta\theta(f)$, can be accurately modeled as a function of frequency. Similarly, the operating frequency, $f_o$, is accurately deduced from an input tuning parameter of an oscillator for the PLL, $\beta$, which is a measure of frequency, by using the relationship $\beta=\cos(\pi f_o T)$, or $$f_o = \frac{1}{\pi T}\cos^{-1}(\beta).$$

That is, from the available number, $\beta$, that controls the frequency of the numerically controlled oscillator (NCO), the NCO's precise frequency of oscillation, $f_o$ can be determined. One set of input signals to the phase shifter, which are the outputs from the phase shift command source, are the sines and cosines of the differential phase, which in turn is deduced and computed from $\beta$. Explicitly, these expressions are $\sin[\Delta\theta(f_o)]$ and $\cos[\Delta\theta(f_o)]$. Since the value of $f_o$ is known, these sines and cosines can be defined directly as functions of $\beta$. The outputs of the phase-shift command source are $$S(\beta) = \sin\{\Delta\theta[f(\beta)]\} = \sin\left\{\Delta\theta\left[\frac{1}{\pi T}\cos^{-1}(\beta)\right]\right\} \text{ and}$$

$$C(\beta) = \cos\{\Delta\theta[f(\beta)]\} = \cos\left\{\Delta\theta\left[\frac{1}{\pi T}\cos^{-1}(\beta)\right]\right\}.$$

Figure 1:
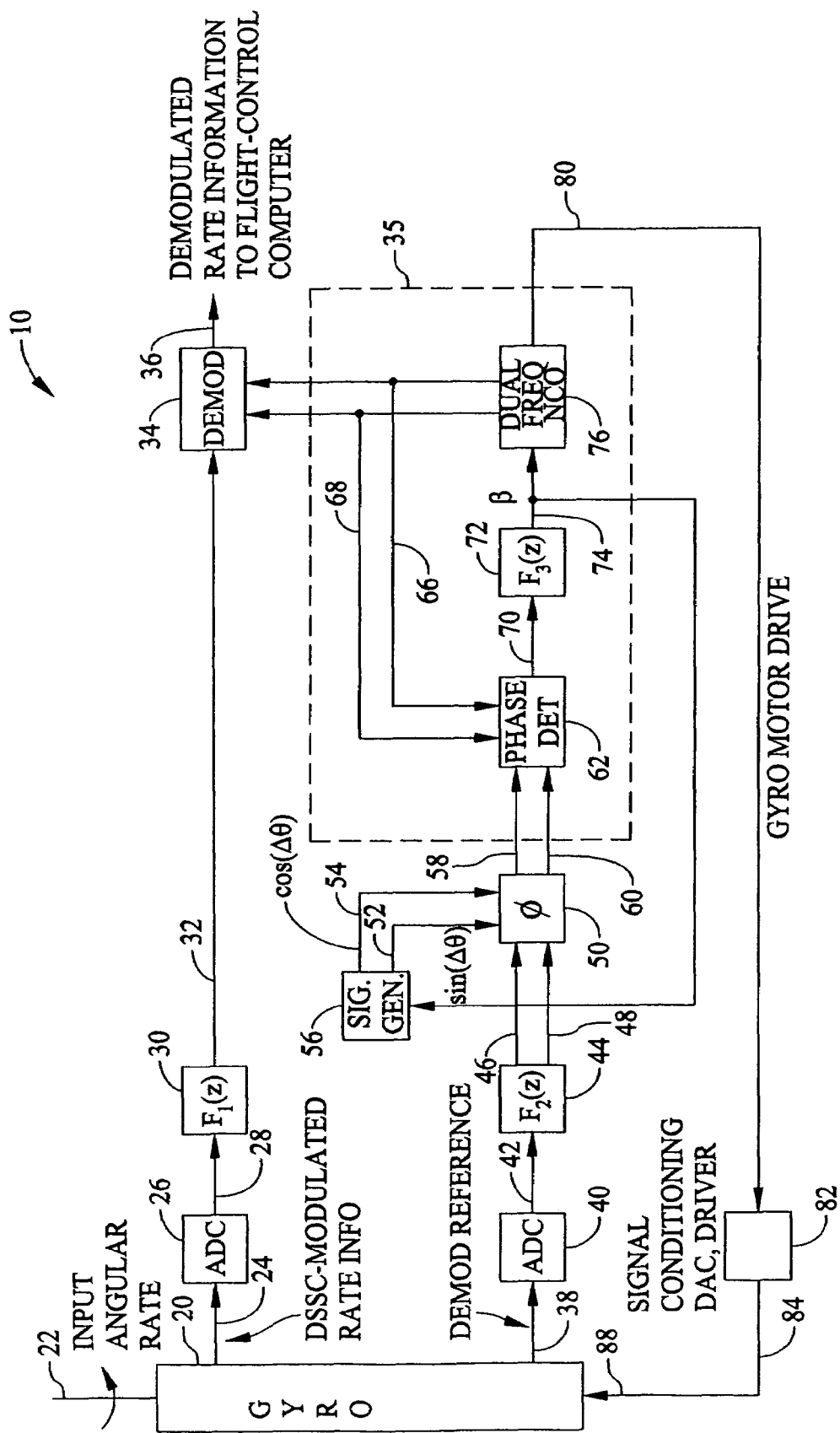
FIG. 1 illustrates a gyroscope angular rate sensing system including a circuit for correction of differential phase error.

Referring to FIG. 1, an angular rate measurement system 10 as shown is built around gyroscope 20 which senses input angular rate 22. A first output 24 of gyroscope 20 is an electrical signal which is a double sideband suppressed carrier (DSSC) modulated representation of the input angular rate 22. First output 24 is input to an analog-to-digital conversion (ADC) system 26 including an internal analog anti-alias filter, a sampler, and a digitizer (none shown). An output 28 from ADC system 26 is input to digital filter 30 and digitally noise filtered. An output signal 32 from digital filter 30 is input to and demodulated by demodulator 34, which as further described below receives demodulating signals from phase locked loop 35. An output 36 from demodulator 34 is a baseband digitized representation of angular input rate 22.

Gyroscope 20 provides a second output 38, which is a sinusoidal demodulation reference signal. Second output 38 is connected to a second ADC system 40, functionally identical to ADC system 26. An output 42 from ADC 40 is then input to a second digital filter 44 for digital noise filtering and signal conditioning. Digital filter 44 includes a bandpass noise filter, automatic gain control (AGC), and a 90-degree phase shifter (none shown). Digital filter 44 generates, as an output, a first amplitude controlled digitized sinusoidal signal 46 and a second amplitude controlled digitized sinusoidal signal 48, which are separated in phase by ninety degrees.

In one embodiment, sinusoidal signals 46 and 48 output from digital filter 44 are applied to phase shifter 50 which advances sinusoidal signals 46 and 48 in phase by angle $\Delta\theta(f_o)$. A second pair of input signals 52 and 54 representing $$S(\beta) = \sin\left\{\Delta\theta\left[\frac{1}{\pi T}\cos^{-1}(\beta)\right]\right\} \text{ and } C(\beta) = \cos\left\{\Delta\theta\left[\frac{1}{\pi T}\cos^{-1}(\beta)\right]\right\}$$

from a phase shift signal generator 56, sometimes referred to as a phase shift command source, are also applied to phase shifter 50. Output signals 58 and 60 of phase shifter 50, which are input to phase locked loop 35, are equivalent to sinusoidal signals 46 and 48 advanced in phase by angle $\Delta\theta(f_o)$.

Output signals 58 and 60 are input to a phase detector 62 within phase locked loop 35, and constitute what is commonly referred to as a sine/cosine pair. A second sine/cosine pair, demodulation signals 66 and 68 (described further below) are also input into phase detector 62. A PLL phase error signal 70 is output from phase detector 62 and is the sine of a phase difference between the two sine/cosine pairs (signals 58 and 60 and signals 66 and 68). PLL phase error signal 70 is input to a servo equalizer 72 whose output 74 is a tuning parameter, $\beta=\cos(2\pi f_m T)$, for dual frequency numerically controlled oscillator (NCO) 76 and an input to phase shift signal generator 56. NCO 76 outputs a motor drive signal 80 at a fundamental motor drive frequency $f_m$ and demodulation signals 66 and 68 at the gyroscope output frequency $f_o=2f_m$, therefore the tuning parameter is calculated as $\beta=\cos(\pi f_o T)$. Motor drive signal 80 is connected to an input of signal conditioning element 82 which includes a signal conditioner (not shown), a digital-to-analog converter (DAC) (not shown), and a power driver (not shown). An output 84 of signal conditioning element 82 is connected to a motor drive input 88 of gyroscope 20.

Figure 2:
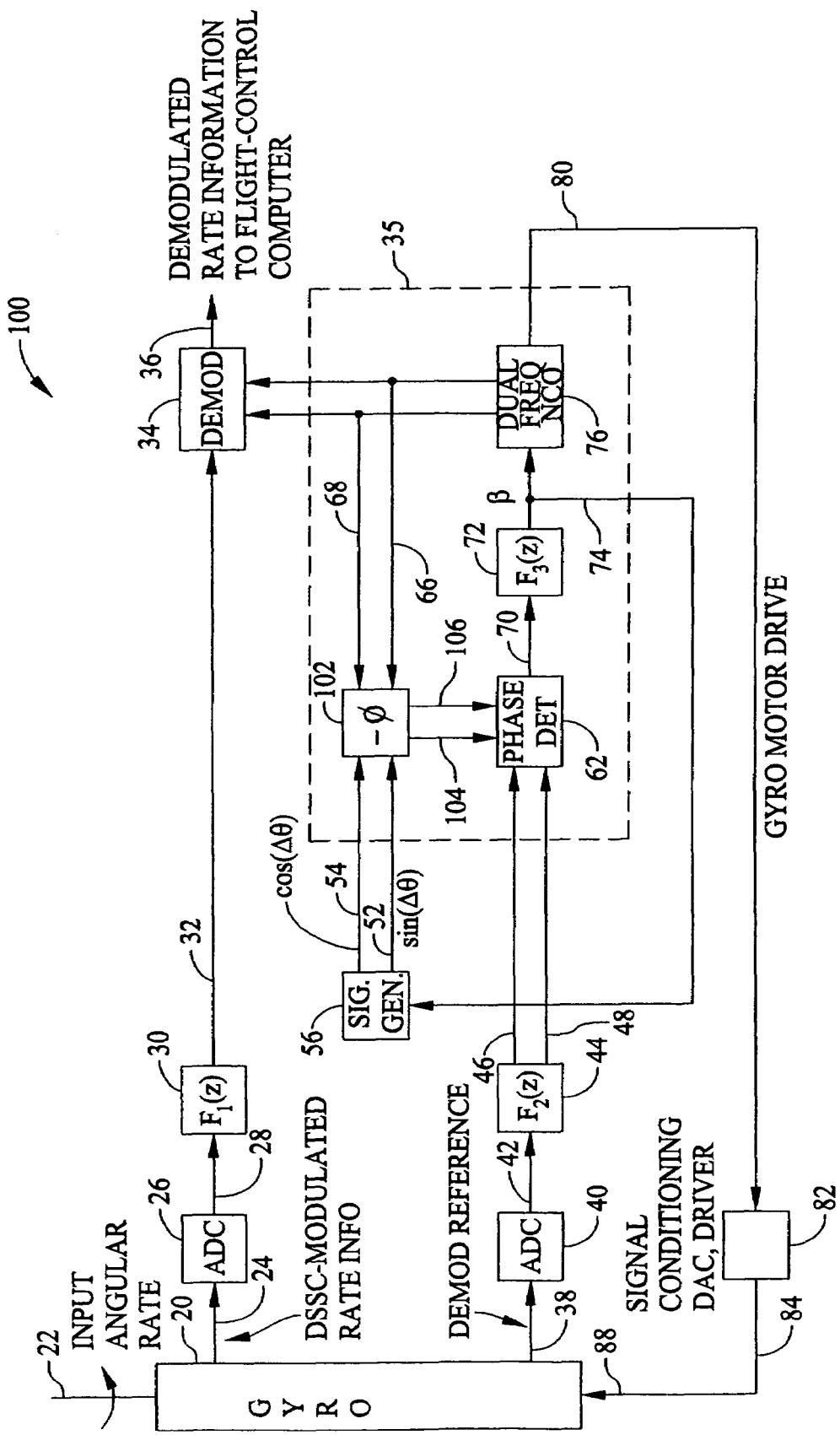
FIG. 2 illustrates the gyroscope angular rate sensing system of FIG. 1 including an alternative configuration for correction of differential phase error.

FIG. 2 is an illustration of an angular rate measurement system 100, where phase shifting of sine/cosine pairs is accomplished differently than system 10 (shown in FIG. 1). Elements within FIG. 2 which are identical to elements of FIG. 1 are shown in FIG. 2 using the same reference numerals used in FIG. 1. Output signals 46 and 48 from digital filter 44 are input to phase detector 62. Signals 52 and 54 representing $$S(\beta) = \sin\left\{\Delta\theta\left[\frac{1}{\pi T}\cos^{-1}(\beta)\right]\right\} \text{ and } C(\beta) = \cos\left\{\Delta\theta\left[\frac{1}{\pi T}\cos^{-1}(\beta)\right]\right\}$$

from phase shift signal generator 56, as described above, are applied to a negative phase shifter 102. Signals 66 and 68 from dual frequency (NCO) 76 are applied to negative phase shifter 102 which retards both signals 66 and 68 in phase by angle $\Delta\theta(f_o)$. Output signals 104 and 106 from negative phase shifter 102 are equivalent to signals 66 and 68 retarded in phase by angle $\Delta\theta$.

PLL phase error signal 70 is output from phase detector 62 and is the sine of a phase difference between the two sine/cosine pairs (signals 46 and 48 and signals 104 and 106). PLL phase error signal 70 is input to a servo equalizer 72 whose output 74 is a tuning parameter, $\beta=\cos(2\pi f_m T)$, for dual frequency NCO 76 and an input to phase shift signal generator 56. NCO 76 outputs a motor drive signal 80 at a fundamental motor drive frequency $f_m$ and demodulation signals 66 and 68 at the gyroscope output frequency $f_o=2f_m$, therefore the tuning parameter is calculated as $\beta=\cos(\pi f_o T)$. Motor drive signal 80 is connected to the input of signal conditioning element 82. Output 84 of signal conditioning element 82 is connected to motor drive input 88 of gyroscope 20.

Phase shifting in phase shifters 50 (shown in FIG. 1) or 102 is implemented to ensure that demodulation reference signals 66 and 68 are precisely in (and out of) phase with the suppressed carrier of signal 32. The frequency sensitive phase shift difference, $\theta(f_o)$, (differential phase) between the suppressed carrier of signal 32 and the demodulation reference, signals 46 and 48, is modeled. The suppressed carrier frequency of signal 32 is calculated as $$f_o = \frac{1}{\pi T}\cos^{-1}(\beta),$$

therefore the amount of phase correction needed is obtained directly from computing $$\Delta\theta\left[\frac{1}{\pi T}\cos^{-1}(\beta)\right].$$

Figure 5:
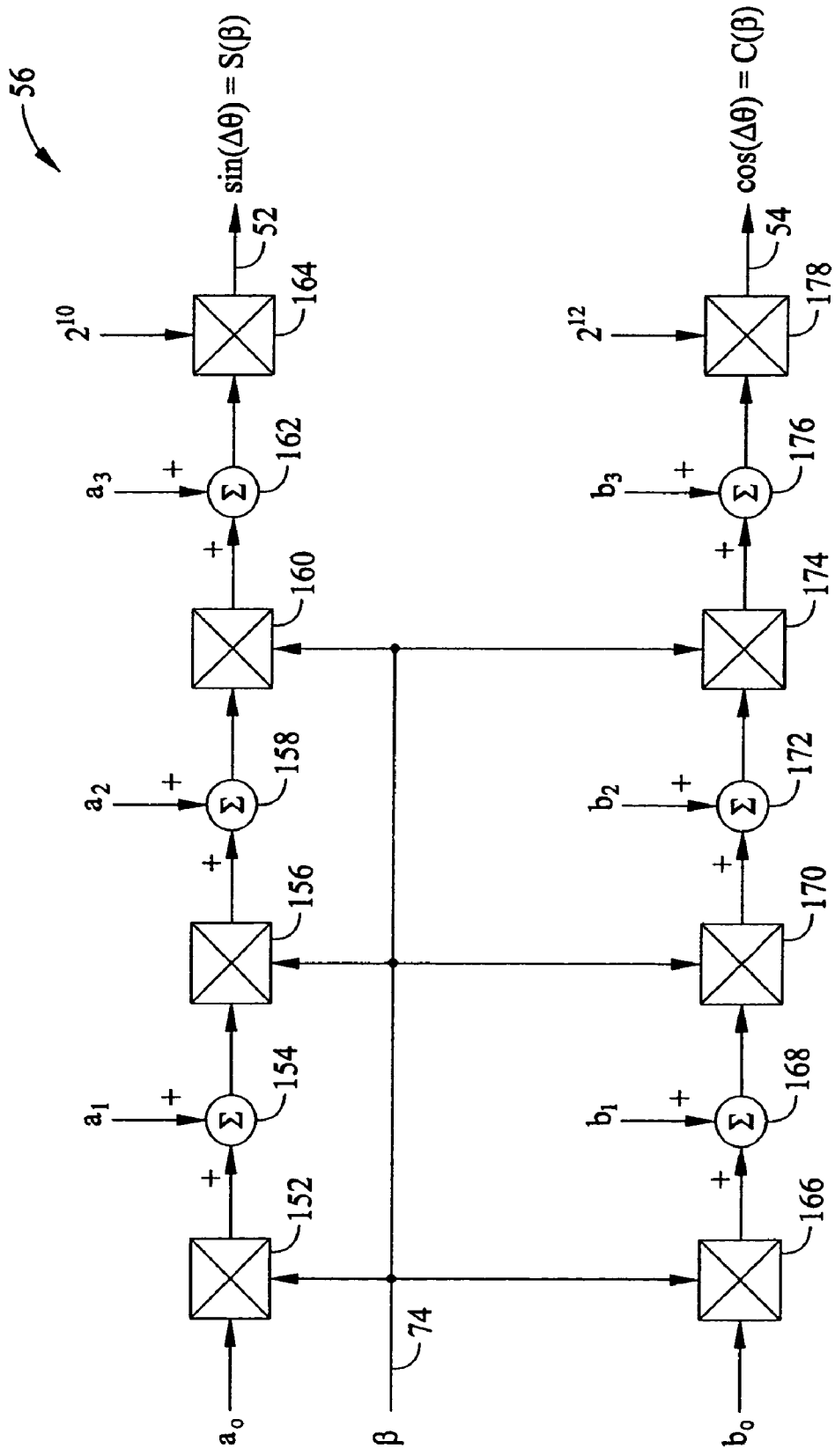
FIG. 5 is a detailed block diagram of a signal generator circuit for generating inputs to the phase shifter circuits of FIGS. 3 and 4.

Finally, since it is desired to generate both the sine and cosine in signal generator 56, the sine and cosine of $\Delta\theta(f_o)$ as a function of $\beta$ is obtained by methods such as storing pre-computed values in a memory to be addressed by $\beta$ or by approximating these functions utilizing power series computations, with relatively few terms, as shown in FIG. 5.

Figure 3:
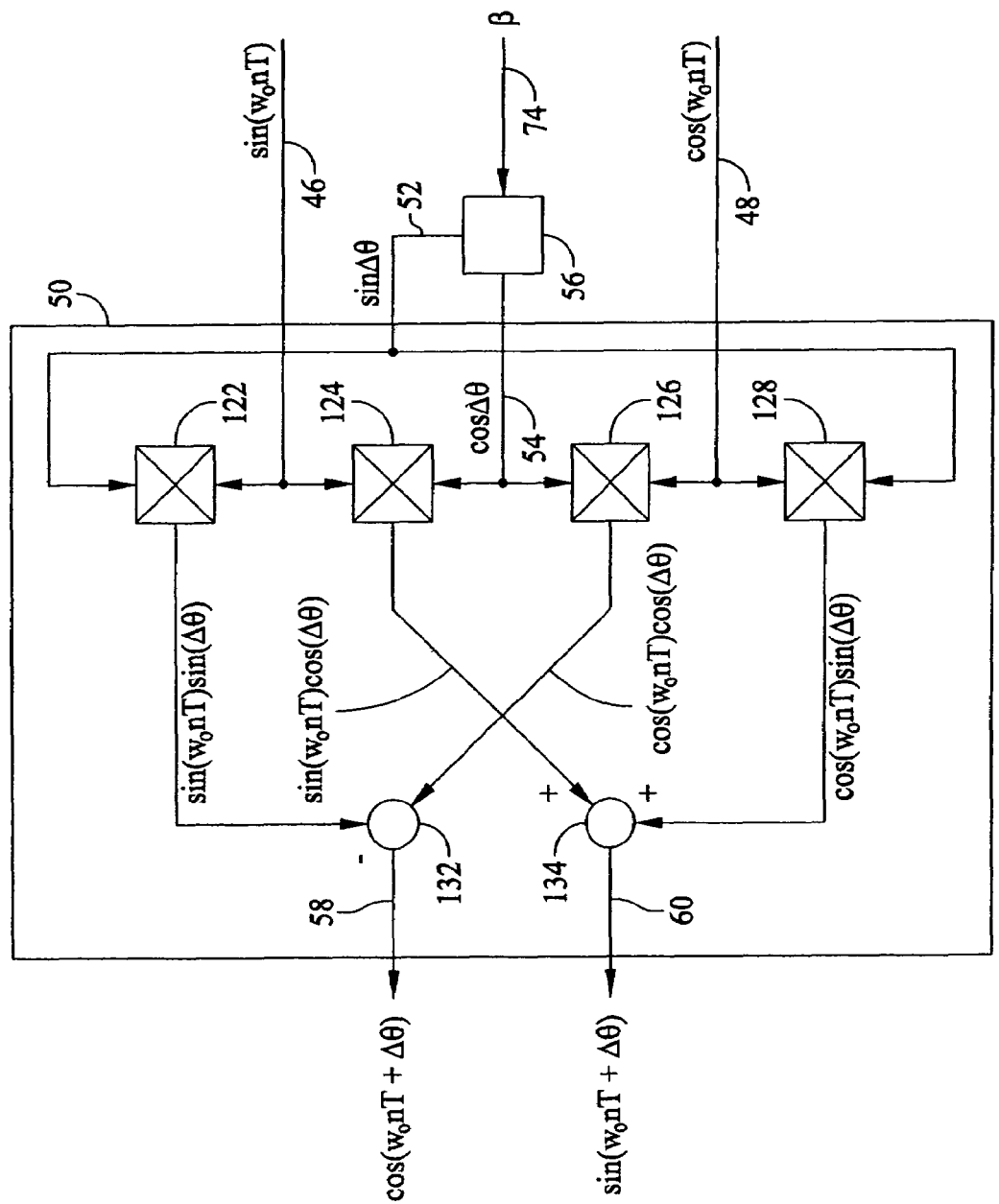
FIG. 3 illustrates an embodiment of a phase shifter circuit used in the angular rate sensing system of FIG. 1.

FIG. 3 is a detailed block diagram of phase shifter 50 (shown in FIG. 1). Phase shifter 50 includes a plurality of multipliers 122, 124, 126, and 128, a subtraction element 132, and an addition element 134. In phase shifter 50, phase advanced cosine signal 58 is generated in subtraction element 132 by subtracting a product of signals 46 and 52 formed in multiplier 122 from the product of signals 48 and 54 formed in multiplier 126. A phase advanced sine signal 60 is generated in addition element 134 by summing the product of signals 54 and 46 formed in multiplier 124 with the product of signals 48 and 52 formed in multiplier 128. Signals 52 and 54, as described above, represent $\sin(\Delta\theta)$ and $\cos(\Delta\theta)$ from phase shift signal generator 56, which is described in detail below with respect to FIG. 5.

Figure 4:
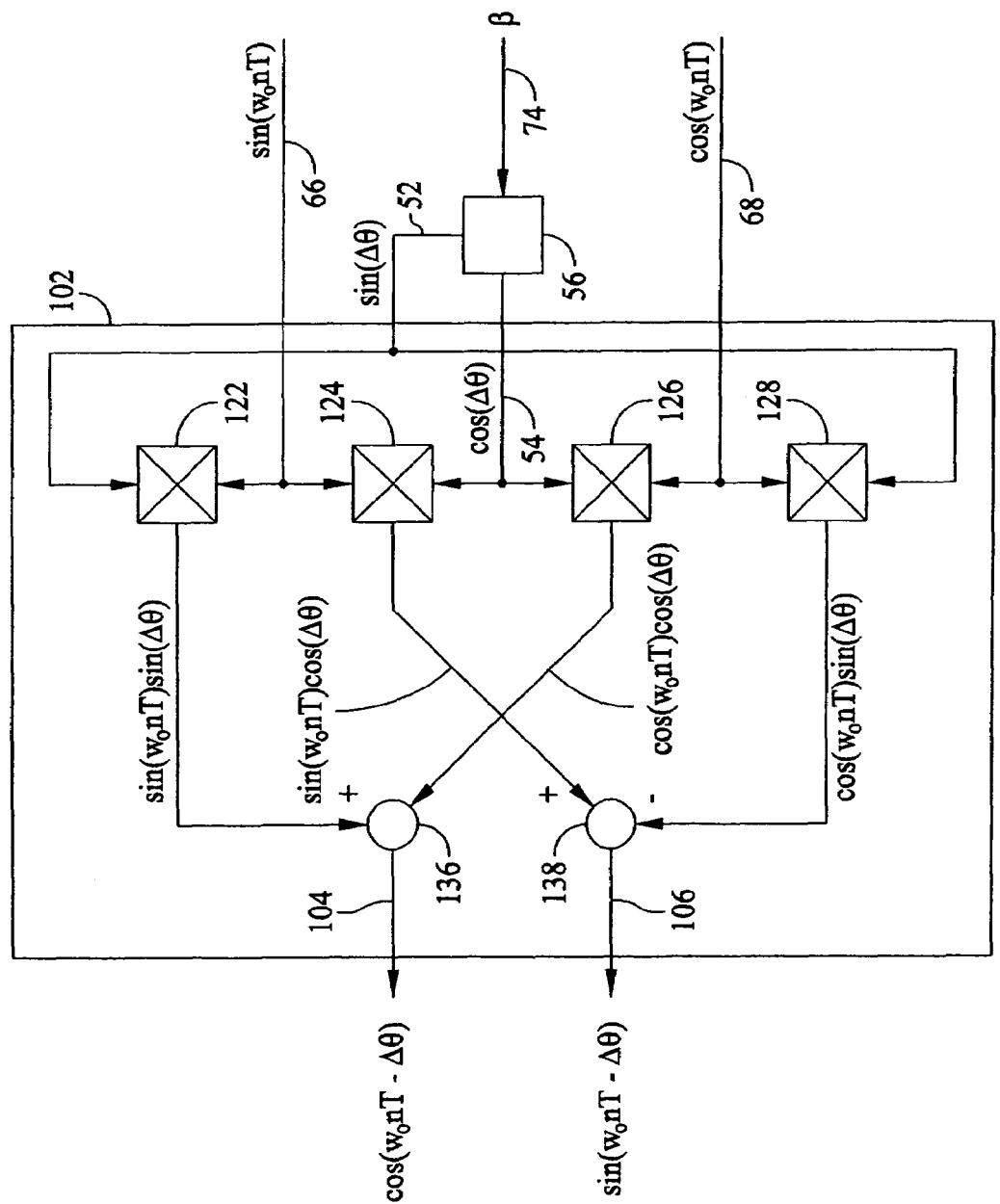
FIG. 4 illustrates an embodiment of a phase shifter circuit used in the angular rate sensing system of FIG. 2.

FIG. 4 is a detailed block diagram of phase shifter 102 (shown in FIG. 2). Phase shifter 102 includes identical multipliers 122, 124, 126, and 128, addition element 136 and subtractor element 138 as included in phase shifter 50 (shown in FIG. 3). In phase shifter 102, a phase retarded cosine signal 104 is generated in addition element 136 by summing the product of signals 66 and 52 formed in multiplier 122 with the product of signals 68 and 54 formed in multiplier 126. A phase retarded sine signal 106 is generated in subtraction element 138 by subtracting the product of signals 52 and 68 formed in multiplier 128 from the product of signals 66 and 54 formed in multiplier 124.

FIG. 5 is a detailed block diagram of signal generator 56 which produces signals 52 $S(\beta)$ and 54 $C(\beta)$. A coefficient $a_0$ is scaled by tuning parameter 74 ($\beta$) in multiplier 152 and then summing the product with a coefficient $a_1$ in adder 154. The sum from adder 154 is scaled by tuning parameter 74 ($\beta$) in multiplier 156, and the product is summed with a coefficient $a_2$ in adder 158. The sum from adder 158 is scaled by tuning parameter 74 ($\beta$) in multiplier 160, and the product is summed with a coefficient $a_3$ in adder 162. In one embodiment, the sum from adder 162 is scaled by $2^{10}$ in multiplier 164 producing output signal 52, denoted by $S(\beta)$. Similarly, to generate an output signal 54, denoted by $C(\beta)$, a coefficient $b_0$ is scaled by tuning parameter 74 ($\beta$) in multiplier 166. A product from multiplier 166 is summed with a coefficient $b_1$ in adder 168, whose sum is scaled by tuning parameter 74 ($\beta$) in multiplier 170. A product from multiplier 170 is summed with a coefficient $b_2$ in adder 172, and the sum from adder 172 is scaled by tuning parameter 74 ($\beta$) in multiplier 174. The product from multiplier 174 is summed with a coefficient $b_3$ in adder 176, whose sum is scaled, in one embodiment, by $2^{12}$ in multiplier 178 generating output signal 54 $C(\beta)$.

The above described computations indicate that, at least in one embodiment, signal generator 56 is configured to compute power series approximations for $S(\beta)$ and $C(\beta)$. Specifically, $S(\beta)$ and $C(\beta)$ are computed through power series approximations $$S(\beta) = \sum_{n=0}^{N-1} a_n \beta^n \text{ and } C(\beta) \sum_{n=0}^{N-1} b_n \beta^n,$$

where N is a number of terms in the expansion to achieve a desired accuracy. In the embodiment shown in FIG. 5, N is equal to four, which bound peak errors to well under one percent. In another embodiment, delays and phase shifts are measured allowing $S(\beta)$ and $C(\beta)$ to be pre-computed and stored within a memory (not shown).

By phase shifting signals which are applied to phase detector 62 (shown in FIGS. 1 and 2), sensitivity to demodulation phase error in a gyroscope angular rate sensing system can be substantially eliminated. Utilization of a zero delay phase shifter 50, 102, as described herein, and based upon expansion of sines and cosines, provides the sum of two angles. Zero delay phase shifter 50, 102 is placed in one of two signal paths to phase detector 62 of a PLL, a digital oscillator output path or a demodulation reference signal path. An amount of phase shift to be introduced, in one embodiment, is determined by modeling. Although the phase shift amount is frequency sensitive, it can be pre-computed, since an operating frequency of the PLL is determined by the tuning parameter, $\beta$. In one embodiment, $\beta$ is used to directly determine the sine and cosine of the amount of phase shift. The resulting sine and cosine can be stored in a memory, to be addressed by $\beta$. In an alternative embodiment, the sine and cosine are approximated by Chebychev expansions which are driven by the independent variable, $\beta$.

While the invention has been described in terms of various specific embodiments, those skilled in the art will recognize that the invention can be practiced with modification within the spirit and scope of the claims.

What is claimed is:

1. An apparatus to eliminate a frequency-dependent differential phase shift, $\Delta\theta$, between a double sideband suppressed carrier modulated angular rate information signal and its sinusoidal demodulation reference signal in a gyroscope angular rate sensing circuit, the circuit including a demodulation reference source, said apparatus comprising:
    a demodulator;
    a phase shifter in a demodulation reference signal path, the demodulation reference signal path being between the demodulation reference source and said demodulator, said phase shifter configured to adjust a phase of the sinusoidal demodulation reference signal;
    a phase locked loop (PLL) comprising a phase detector, a servo equalizer, and a dual-frequency, numerically controlled oscillator, said PLL configured to provide a demodulation signal based on the phase shifted demodulation reference signal; and
    a phase shift command source comprising frequency dependent outputs and configured to provide an input to said phase shifter to command an appropriate phase adjustment, the frequency dependent outputs based upon a tuning parameter, $\beta$, of a numerically controlled oscillator (NCO) in said PLL that is controlled by the demodulation reference signal.

2. An apparatus according to claim 1 wherein said frequency dependent outputs comprise sin [$\Delta\theta(f)$] and cos [$\Delta\theta(f)$].

3. An apparatus according to claim 1 wherein said phase shift command source is configured to provide said frequency dependent outputs according to.

$$S(\beta) = \sin\left\{\Delta\theta\left[\frac{1}{\pi T}\cos^{-1}(\beta)\right]\right\} \text{ and } C(\beta) = \cos\left\{\Delta\theta\left[\frac{1}{\pi T}\cos^{-1}(\beta)\right]\right\}.$$

4. An apparatus according to claim 1 wherein said phase shift command source is configured to provide said frequency dependent outputs according to power series approximations $$S(\beta) = \sum_{n=0}^{N-1} a_n \beta^n \text{ and } C(\beta) \sum_{n=0}^{N-1} b_n \beta^n,$$

where N is a number of terms in the power series to achieve a desired accuracy.

5. An apparatus according to claim 1 wherein functions for said frequency dependent outputs are pre-determined and stored in a memory.

6. A method for eliminating a differential phase shift, $\Delta\theta$, between a double sideband suppressed carrier modulated information signal and its sinusoidal demodulation reference signal in a circuit, the circuit including a demodulator, a phase shift command source and a phase shifter in a reference signal path between a signal reference source and the demodulator, said method comprising:
    generating an appropriate phase adjustment command from the phase shift command source to the phase shifter by providing frequency dependent outputs sin [$\Delta\theta(f)$] and cos [$\Delta\theta(f)$], from the phase shift command source; and
    adjusting a phase of the sinusoidal demodulation reference signal with the phase shifter, the differential phase shift being frequency dependent according to $\Delta\theta(f)$.

7. A method according to claim 6 wherein said generating an appropriate phase adjustment command comprises driving the phase shift command source with a parameter that is a measure of frequency.

8. A method according to claim 6 wherein the circuit includes a numerically controlled oscillator (NCO) in a phase locked loop (PLL), and wherein a frequency dependence of the outputs of the phase shift command source is based on a tuning parameter, $\beta$, of the NCO which is controlled by the demodulation reference signal.

9. A method according to claim 8 further comprising:
    pre-determining phase shift command source output functions;
    storing the functions in a memory; and
    addressing the memory using the tuning parameter, $\beta$.

10. A method according to claim 8 wherein generating an appropriate phase adjustment comprises calculating phase shift command source outputs according to $$S(\beta) = \sin\left\{\Delta\theta\left[\frac{1}{\pi T}\cos^{-1}(\beta)\right]\right\} \text{ and } C(\beta) = \cos\left\{\Delta\theta\left[\frac{1}{\pi T}\cos^{-1}(\beta)\right]\right\}.$$

11. A method according to claim 8 wherein generating an appropriate phase adjustment comprises calculating phase shift command source outputs utilizing the power series approximations $$S(\beta) = \sum_{n=0}^{N-1} a_n \beta^n \text{ and } C(\beta) = \sum_{n=0}^{N-1} b_n \beta^n,$$

where N is a number of terms in the expansion to achieve a desired accuracy.

12. An angular rate measurement system comprising:
    a first analog to digital converter (ADC);
    a gyroscope configured to sense an angular rate input and provide a modulated angular rate information signal and a sinusoidal demodulation reference signal;
    a demodulator configured to demodulate a signal representative of the angular rate information signal;
    a phase shifter configured to adjust a phase of a signal representative of the sinusoidal demodulation reference signal;
    a phase locked loop configured to provide a demodulation signal to said demodulator, the demodulation signal based on the phase adjusted demodulation reference signal;
    a phase shift command source configured to provide a frequency based input to said phase shifter to enable an appropriate phase adjustment of the demodulation reference signal, the phase adjustment eliminating a frequency dependent differential phase shift, $\Delta\theta(f)$, between the modulated angular rate information signal and the sinusoidal demodulation reference signal; and
    a first digital filter, said first ADC and said first filter configured to provide the signal representative of the angular rate information signal from the modulated angular rate information signal.

13. An angular rate measurement system according to claim 12 comprising:
   a second analog to digital converter (ADC); and
   a second digital filter, said second ADC and said second filter configured to provide the signal representative of the sinusoidal demodulation reference signal from the sinusoidal demodulation reference signal.

14. An angular rate measurement system according to claim 13 wherein the frequency based input to said phase shifter from said phase shift command source is configured to provide a frequency based input to said phase shifter to enable an appropriate phase adjustment of the demodulation reference signal.

15. An angular rate measurement system according to claim 14 wherein said PLL comprises a numerically controlled oscillator, said phase shift command source provides outputs of $$S(\beta) = \sin\{\Delta\theta[f(\beta)]\} = \sin\left\{\Delta\theta\left[\frac{1}{\pi T}\cos^{-1}(\beta)\right]\right\} \text{ and } C(\beta) = \cos\{\Delta\theta[f(\beta)]\} = \cos\left\{\Delta\theta\left[\frac{1}{\pi T}\cos^{-1}(\beta)\right]\right\}$$

where $\beta$ input tuning parameter for said PLL according to the relationship $\beta=\cos(\pi f_o T)$, where $f_o$ is an operating frequency of said numerically controlled oscillator.

16. An angular rate measurement system according to claim 15 wherein to provide the signal representative of the sinusoidal demodulation reference signal, said digital filter outputs a first amplitude controlled digitized sinusoidal signal and a second amplitude controlled digitized sinusoidal signal, which are separated in phase by ninety degrees, said phase shifter configured to advance the first and second sinusoidal signals in phase by $\Delta\theta(f_o)$.

17. An angular rate measurement system according to claim 15 wherein to provide the signal representative of the sinusoidal demodulation reference signal, said digital filter outputs a first amplitude controlled digitized sinusoidal signal and a second amplitude controlled digitized sinusoidal signal, which are separated in phase by ninety degrees, said phase detector configured to receive the first and second sinusoidal signals, the signals $S(\beta)$ and $C(\beta)$ are received from said phase shift command source at said phase shifter, said phase shifter configured to retard demodulation signals in phase by $\Delta\theta(f_o)$, utilizing the signals $S(\beta)$ and $C(\beta)$.

* * * * *

UNITED STATES PATENT AND TRADEMARK OFFICE
CERTIFICATE OF CORRECTION

PATENT NO. : 7,224,759 B2  Page 1 of 1
APPLICATION NO. : 10/193416
DATED : May 29, 2007
INVENTOR(S) : White It is certified that error appears in the above-identified patent and that said Letters Patent is hereby corrected as shown below:

In Claim 15, column 10, line 1, please insert --is an-- after the first occurrence of "β"

In Claim 16, column 10, line 7, please insert --second-- after the first occurrence of the word "said"

In Claim 17, column 10, line 14, please insert --second-- after the first occurrence of the word "said"

Signed and Sealed this

Fourth Day of December, 2007

JON W. DUDAS
*Director of the United States Patent and Trademark Office*